(12) United States Patent
Miyamoto et al.

(10) Patent No.: US 6,960,729 B2
(45) Date of Patent: Nov. 1, 2005

(54) UPRIGHT-PIN-JOINED RESIN SUBSTRATE, METHOD OF PRODUCING THE SUBSTRATE, PINS, AND METHOD OF PRODUCING THE PINS (75) Inventors: Noritaka Miyamoto, Aichi (JP); Hajime Saiki, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 218 days.

(21) Appl. No.: 10/121,858

(22) Filed: Apr. 15, 2002

(65) Prior Publication Data

US 2003/0027463 A1 Feb. 6, 2003

(30) Foreign Application Priority Data

Jul. 27, 2001 (JP) ....................................... 2001-228135

(51) Int. Cl.⁷ .......................... H01R 12/04; H05K 1/11
(52) U.S. Cl. ........................................ 174/267; 29/843
(58) Field of Search ................. 174/267; 361/772–776; 29/842–845

(56) References Cited

U.S. PATENT DOCUMENTS

| 6,359,332 | B2 | * | 3/2002 | Shiraishi | .................... | 257/697 |
| 6,376,782 | B1 | * | 4/2002 | Kimura et al. | .............. | 174/267 |
| 6,555,757 | B2 | * | 4/2003 | Saiki et al. | ................. | 174/256 |
| 6,583,366 | B2 | * | 6/2003 | Saiki | ........................ | 174/267 |

FOREIGN PATENT DOCUMENTS

| JP | 62-86151 | 4/1987 |
| JP | 62-106652 | 5/1987 |
| JP | 63-119183 | 5/1988 |
| JP | 63-272061 | 11/1988 |
| JP | 4-6253 | 1/1992 |
| JP | 6-21312 | 1/1994 |
| JP | 6-158251 | 6/1994 |
| JP | 9-321209 | 12/1997 |
| JP | 2000-49252 | 2/2000 |
| JP | 2000-164785 | 6/2000 |
| JP | 2000-164786 | 6/2000 |

OTHER PUBLICATIONS

Japanese Office Action for Japanese Patent Application No. 2001–228135 dated Apr. 13, 2004.

* cited by examiner

Primary Examiner—David A. Zarneke
Assistant Examiner—Jeremy Norris
(74) Attorney, Agent, or Firm—Sughrue Mion, PLLC

(57) ABSTRACT

An upright-pin-joined resin substrate 11 includes a resin substrate 13 formed from a resin or a similar material and having a main plane 13A and a pin pad 17AP exposed on the main plane; and a number of pins 1 joined to the pin pads 17AP by means of a solder HD. The pins 1 are obtained by shaping a wire material MT which is formed of 194 Alloy and has been heat-treated in advance at 450° C. to 900° C. The pin 1 includes a shaft portion 1A and an enlarged-diameter portion 1B having a round surface projecting in a direction opposite the shaft portion 1A. The enlarged-diameter portion 1B and another portion are joined to the pin pad 17AP through soldering. Also disclosed is a method of producing the upright-pin-joined resin substrate; a pin to be employed in the upright-pin-joined resin substrate; and a method of producing the pin.

10 Claims, 9 Drawing Sheets

UPRIGHT-PIN-JOINED RESIN SUBSTRATE, METHOD OF PRODUCING THE SUBSTRATE, PINS, AND METHOD OF PRODUCING THE PINS

BACKGROUND OF THE INVENTION

1. Field of the Invention

The present invention relates to an upright-pin-joined resin substrate having pins serving as input/output terminals arranged in a standing posture, a method of producing the upright-pin-joined resin substrate, a pin serving as an input/output terminal provided in the upright-pin-joined resin substrate, and a method of producing the pin.

2. Description of the Related Art

Conventionally, an upright-pin-joined resin substrate has been known; i.e., a resin substrate having pins which serve as input/output terminals. The pins are provided on a resin substrate formed from a resin or a resin-containing composite material, and are arranged in a standing posture.

Figure 9:
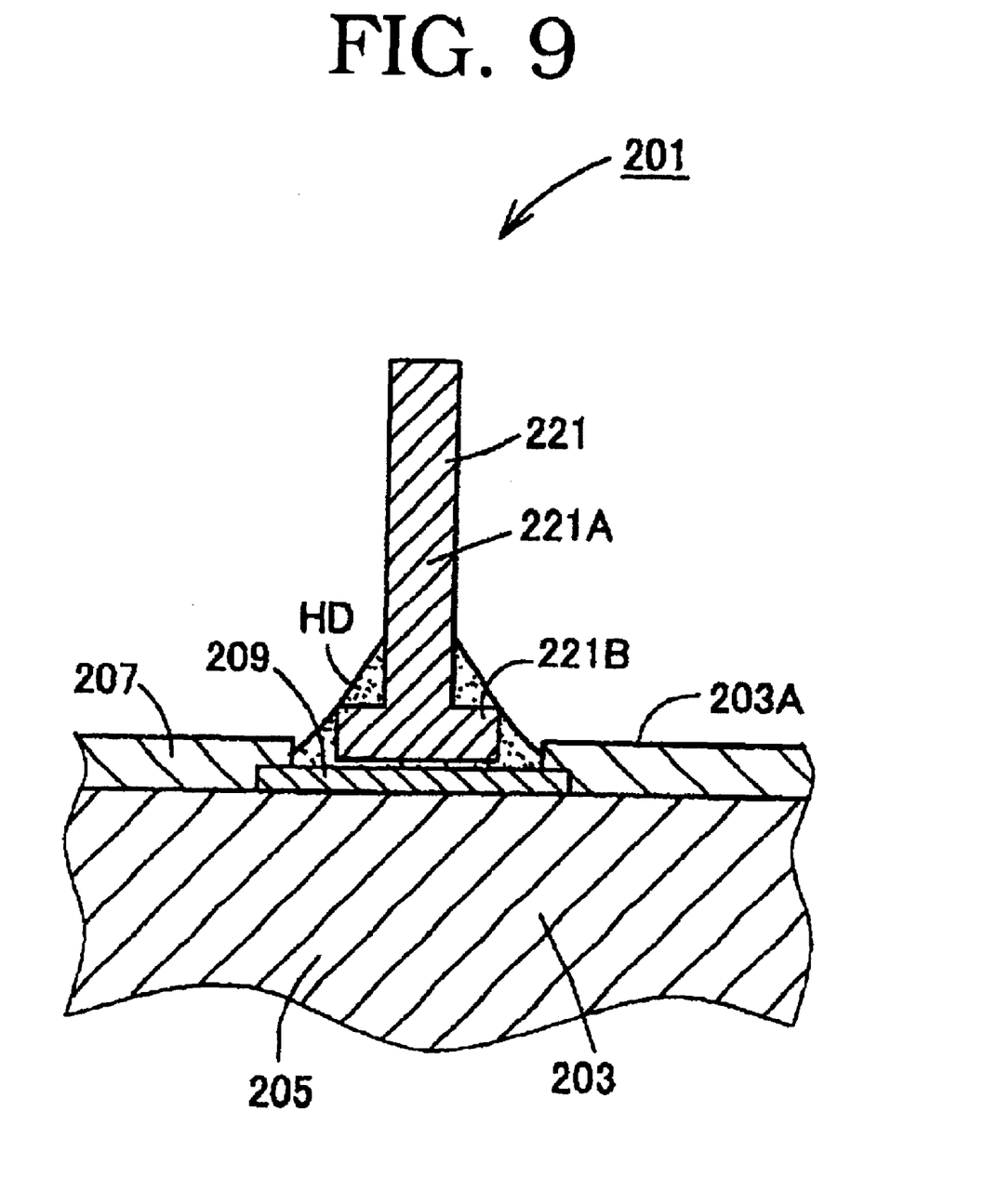
FIG. 9 is a partially enlarged cross-sectional view showing a conventional upright-pin-joined resin substrate.

An example of such an upright-pin-joined resin substrate is shown in FIG. 9, which is a partially enlarged cross-sectional view of an upright-pin-joined substrate 201. The upright-pin-joined resin substrate 201 includes a resin substrate 203 having a generally rectangular plate-like shape, and a number of pins 221 arranged on the substrate in a standing posture.

The resin substrate 203 includes a resin insulating layer 205 having wiring layers (not shown) formed in the interior and on the surface thereof, and a number of pin pads 209 exposed through a solder resist layer 207 on the a main plane 203A side (on the upper side in FIG. 9).

The pin 221 is formed of a material such as 194 Alloy (Cu— (2.1–2.6 wt. %)Fe— (0.05–0.2 wt. %)Zn— (0.015–0.15 wt. %) P), and includes a generally cylindrical shaft portion 221A and a generally disk-like enlarged-diameter portion 221B joined to the surface of one of the pin pads 209. The entirety of the enlarged-diameter portion 221B and a part of the shaft portion 221A connecting with the enlarged-diameter portion 221B are joined to the pin pad 209 by means of a solder HD, to thereby fixedly join the pin 221 to the resin substrate 203. The material used for forming the pin 221 is not necessarily limited to 194 Alloy, and examples of the material include copper materials such as pure copper, phosphor bronze, nickel silver, and beryllium copper, and ferrous materials such as kovar (Fe—Ni—Co alloy) and 42 Alloy (Fe-42 wt. % Ni alloy).

3. Problems to be Solved by the Invention

However, when stress is applied to the pin 221 as is the case where the pin 221 is pulled, even though the stress is comparatively small, the aforementioned upright-pin-joined resin substrate 201 may fracture at the solder portion HD between the pin 221 and the pin pad 209 or a scoop portion of the resin substrate 203 (resin insulating layer 205) may be removed. The reason for the fracture is considered to be as follows. The pin 221, having high hardness, cannot absorb stress generated due to soldering or stress applied thereto during a tensile test or other processes. If the stress is concentrated for some reason, the solder HD between the pin 221 and the pin pad 209 or the resin substrate 203 (resin insulating layer 205) fractures prior to occurrence of a fracture in the shaft portion 221A of the pin 221.

When such pins 221 joined to a substrate are subjected to a tensile test, some exhibit such a high connection strength such that joining is maintained until the shaft portion 221A of each hard pin 221 fractures, whereas others exhibit exceptionally poor connection strength. Thus, variation in connection strength among the pins is rather large, resulting in joining of poor reliability.

SUMMARY OF THE INVENTION

The present invention has been achieved in view of the foregoing, and an object of the invention is to provide an upright-pin-joined resin substrate which is fracture resistant under stress applied to the pins and which provides high reliability. Another object of the invention is to provide a method of producing the upright-pin-joined resin substrate. Still another object of the invention is to provide a pin for producing the upright-pin-joined resin substrate. Yet another object of the invention is to provide a method of producing the pin.

The above objects of the present invention have been achieved by providing an upright-pin-joined resin substrate comprising a resin substrate of a generally plate-like shape having a main plane, formed from a resin or a resin-containing composite material, and including a pin pad exposed on the main plane; and pins joined to the pin pad by means of a solder, wherein the pins are formed from a wire material which has been softened through heat treatment, such that each pin has a shaft portion and an enlarged-diameter portion greater in diameter than the shaft portion, the enlarged-diameter portion being formed at one end of the shaft portion; and in which at least the enlarged-diameter portion is joined to the pin pad by means of a solder.

Generally, pins are produced by working (e.g., pressing) a wire material into a predetermined shape. In order to produce a wire material of a predetermined diameter, a raw material is subjected to working such as drawing. The thus-produced wire material is hardened by virtue of strain generated during working. In addition, during the formation of pins, working for forming an enlarged-diameter portion or a similar working process causes hardening. It follows that the pins thus produced are harder than the raw material from which pins have been produced.

One conceivable approach is to soften the pins once formed through heat treatment. However, heat treatment of the pins requires a number of steps. Particularly, when a number of pins are placed in a container and subjected to single-batch heat treatment, temperatures of the pins during heat treatment may vary in accordance with the positions of the pins placed in the container. Preferably, the number of pins to be placed in the container is limited so as not to be excessive, to thereby attain uniform heat treatment. However, such heat treatment tends to be cumbersome.

In contrast, according to the present invention, a wire material is subjected to heat treatment prior to working the material into pins, to thereby attain greater softness as compared with that of the material prior to the heat treatment. Thus, strain generated in the wire material during working such as drawing is removed in advance, and only hardening occurring during working to form pins (e.g., during working to form enlarged-diameter portions) remains in the produced pins. Since the hardening is not on a significant level, the pins remain comparatively soft. When stress is applied to a pin, the pin itself deforms to absorb the stress, to thereby reduce the stress applied to the joining portion between the pin and the resin substrate or the stress applied to the resin substrate main body.

Therefore, when stress is applied to the pins, the upright-pin-joined resin substrate of the invention is resistant to fracture at the aforementioned portions, has small variation in strength of resistance to fracture, and provides high reliability. Specifically, when the resin substrate is subjected to a tensile test, fracture does not occur at a solder portion between a pin and a pin pad, or in such a manner that a portion of the resin substrate is removed. Instead, the pin fractures in the shaft portion. Thus, small variation in tensile strength among the pins and high reliability are attained.

Conventionally, an upright-pin-joined ceramic substrate has been known having pins arranged on the ceramic substrate, in which the pins have been subjected to high-temperature heat treatment. The pins have been unintentionally subjected to a high temperature; for example, approximately 800° C., which is provided during a typical process for joining the pins to a ceramic substrate through brazing.

In the case of an upright-pin-joined resin substrate, pins are joined to a resin substrate main body through soldering at a low temperature of approximately 200–300° C., in consideration of heat resistance of the resin substrate, and the pins are not particularly subjected to high temperature. Thus, if the pins per se are hard, they cannot sufficiently absorb the applied stress.

However, according to the present invention, as described above, pins are produced from a wire material which has been subjected to heat treatment in advance. Since the thus-produced pins are soft, stress applied to the pins tends to be absorbed by the pins, to thereby prevent fracture of the upright-pin-joined resin substrate employing the pins, reduce variation in strength to fracture, and enhance reliability.

The metallic material used to form the wire material and pins is not particularly limited. Examples of the material include copper materials such as pure copper (oxygen-free copper), 194 Alloy (Cu—Fe alloy), phosphor bronze, nickel silver, and brass; and ferrous materials such as kovar (Fe—Ni—Co alloy) and 42 Alloy (Fe—Ni alloy).

The solder used for joining the pins through soldering is appropriately selected in consideration of the heat resistance of a resin substrate main body for producing an upright-pin-joined resin substrate; the soldering temperature at which electronic parts such as IC chips are to be mounted on the upright-pin-joined resin substrate; and other factors. Examples of the solder include Sn/Sb solder, Pb/Sn solder, and Sn/Ag solder. These solders may further contain Cu, Ag, Bi, Au, Pb, In, Al, or As.

Thus, preferably, in the aforementioned upright-pin-joined resin substrate, the solder is any of Sn/Sb solder, Pb/Sn solder, and Sn/Ag solder.

Among these solders, Sn/Sb solder is preferred, since this solder has a low wetting property as compared with other solders such as Pb/Sn solder and, in comparison with other solders, does not readily spread through wetting, to thereby suppress the height of the solder that rises along the shaft portion of each pin.

In the upright-pin-joined resin substrate, the pins are formed from a wire material which has been softened by heat treating preferably at a temperature falling within a range of from 450° C. to 900° C., inclusive.

According to the present invention, the pins are formed from a wire material which has been softened in advance by heat treating at a high temperature of at least 450° C., which is higher than the heating temperature at which the pins are joined to the resin substrate through soldering. Thus, the wire material has been completely heat-treated, and the wire material and the pins formed therefrom are sufficiently softened. Therefore, when stress is applied to the pins, the pins per se sufficiently deform to absorb the stress. As a result, the upright-pin-joined resin substrate employing the pins is highly resistant to fracture, and variation in strength to fracture among the pins is reduced, to thereby provide high reliability.

Since heat treatment of the wire material requires a large amount of energy, excessive heating of the wiring material increases treatment costs. In the present invention, the costs can be reduced by controlling the heating temperature to 900° C. or less.

In a more preferred embodiment, the above heat treatment is performed within a range of from 600° C. to 900° C., inclusive, to thereby sufficiently soften the wire material and the pins.

In any one of the above-described upright-pin-joined resin substrates, the pins are preferably formed of a copper material.

As compared with ferrous materials such as kovar and 42 Alloy, copper materials such as pure copper, 194 Alloy, phosphor bronze, nickel silver, and beryllium copper generate a lower degree of work hardening during working of pins such as formation of an enlarged-diameter portion. Thus, the effect of softening the wire material through heat treatment is maintained even after the pins are formed from the wire material. Pins formed from copper material are particularly preferred, in that soft pins are joined fixedly to a resin substrate main body.

In the upright-pin-joined resin substrate, the pins preferably have a Vicker's hardness (Hv), as measured in accordance with the method defined in JIS Z2244 (1992), of 70–120.

When soft pins having a Vicker's hardness (Hv) of 120 or less are employed in the upright-pin-joined resin substrate, stress applied to the pins is completely absorbed, to thereby prevent fracture of the upright-pin-joined resin substrate, reduce variation in strength to fracture among the pins, and provide high reliability.

However, when the Vicker's hardness (Hv) is 70 or less, the pins become excessively soft. Such pins are difficult to produce through press-working or similar methods.

In any one of the above-described upright-pin-joined resin substrates, the enlarged-diameter portion of each pin preferably has a round surface projecting in a direction opposite the shaft portion.

According to the present invention, the enlarged-diameter portion of the pin has a round surface projecting in a direction opposite the shaft portion. Thus, the pin and the pin pad are joined through soldering in such manner that the round surface of the enlarged-diameter portion faces the pin pad.

As compared with a pin having a nail-head-like flat enlarged-diameter portion, the above pin ensures a larger amount of solder between the enlarged-diameter portion of the pin and the pin pad, thus leading to enhancement of connection strength.

Since the enlarged-diameter portion of the pin has a round surface, stress applied to the pin is not concentrated on a specific point and tends to be absorbed by the entirety of the joining portion. Thus, the stress applied to the pin itself or the stress applied to the resin substrate main body can be reduced.

In addition, the pin is formed from a wire material which has been softened by heat treating at a high temperature as mentioned above. Accordingly, when stress is applied to the pin, the pin itself deforms to absorb the stress, to thereby reduce the stress applied to the joining portion between the pin and the resin substrate or the stress applied to the resin substrate main body.

Through the above synergistic effect, the upright-pin-joined resin substrate is highly resistant to fracture induced by application of stress to the pin, has reduced variation in strength to fracture among pins, and provides high reliability.

Another technique of solving the above problems is a method of producing an upright-pin-joined resin substrate having a main plane and a generally plate-like shape, the substrate being formed from a resin or a resin-containing composite material, and having a pin pad exposed on the main plane, said method comprising a wire material heat treatment step including subjecting a wire material to heat treatment, to thereby soften the material; a pin formation step including forming, from the wire material which has undergone the heat treatment, a pin comprising a shaft portion and an enlarged-diameter portion greater in diameter than the shaft portion formed at one end of the shaft portion; and a pin fixation step including fixing at least the enlarged-diameter portion of said pin on a pin pad through soldering while the enlarged-diameter portion of the pin is caused to abut the pin pad. The substrate may have one or more pin pads, and a plurality of pins may be fixed to respective pin pads.

According to the present invention, a wire material is heat treated in the wire material heat treatment step, to thereby soften the material, followed by forming a pin in the pin formation step. In the pin fixation step, the soft pin is joined through soldering to the pin pad included in the resin substrate.

In the thus-produced upright-pin-joined resin substrate, the pin itself tends to absorb the applied stress, to thereby reduce the stress applied to the joining portion between the pin and the resin substrate, or the stress applied to the resin substrate main body. Thus, the method can provide an upright-pin-joined resin substrate which is highly resistant to fracture under stress applied to the pins, has small variation in strength of resistance to fracture among the pins, and provides high reliability.

In the method of producing an upright-pin-joined resin substrate, the heat treatment preferably comprises heating the wire material at a temperature falling within a range of from 450° C. to 900° C., inclusive.

According to the present invention, the wire material is heated at 450° C. or higher in the wire material heat treatment step, to thereby sufficiently soften the wire material. In the pin fixation step, the pins formed from the wire material are joined through soldering to the pin pad included in the resin substrate. Therefore, the method provides an upright-pin-joined resin substrate which is highly resistant to fracture under stress applied to the pins, which has small variation in strength of resistance to fracture among the pins, and which provides high reliability.

Since heat treatment of the wire material requires a large amount of energy, excessive heating of the wiring material increases treatment costs. In the present invention, the costs can be reduced by controlling the heating temperature in the wire material heat treatment step to 900° C. or less.

In a more preferred method, the above heat treatment is performed within a range of from 600° C. to 900° C., inclusive, to thereby sufficiently soften the wire material and the pins.

In any one of the above-described methods of producing an upright-pin-joined resin substrate, the wire material is preferably a copper material.

As compared with ferrous materials such as kovar and 42 Alloy, copper materials such as pure copper, 194 Alloy, phosphor bronze, nickel silver, and beryllium copper generate a lower degree of work hardening during working of pins such as formation of an enlarged-diameter portion. Thus, the effect of softening the wire material through heat treatment is maintained even after pins are formed from the wire material. The pins formed from copper material are particularly preferred, in that soft pins are fixedly joined to a resin substrate main body.

Another technique for solving the above problems is realized by pins each serving as an input/output terminal and arranged in a standing posture in an upright-pinjoined substrate, which pin comprises a shaft portion and an enlarged-diameter portion greater in diameter than the shaft portion and formed at one end of the shaft portion, wherein the shaft portion and the enlarged-diameter portion are formed from a wire material which has been softened through heat treatment.

The pins according to the present invention are formed from a wire material which has been softened through heat treatment, to thereby attain greater softness as compared with that of pins formed from a wire material which has undergone no heat treatment. Thus, in an upright-pin-joined resin substrate including such pins, the pins themselves tend to absorb applied stress, to thereby reduce the stress applied to the joining portion between the pins and the resin substrate or the stress applied to the resin substrate main body.

Therefore, the upright-pin-joined resin substrate including such pins of the present invention prevents fracture, induced by application of stress to the pins, of the aforementioned portion and the substrate, has small variation in strength to fracture, and provides high reliability.

The pins are formed from the aforementioned wire material which has been softened through heat treatment preferably at a temperature falling within a range of from 450° C. to 900° C., inclusive.

According to the present invention, pins are formed from a wire material which has been softened through heat treatment performed at a high temperature of at least 450° C. Thus, the wire material has been completely heat-treated, and the wire material and the pins formed therefrom are sufficiently softened. Therefore, when an upright-pin-joined resin substrate is produced from the pins of the invention, the substrate surely prevents fracture due to application of stress to the pins, has small variation in strength to fracture, and provides high reliability.

Since heat treatment of the wire material requires a large amount of energy, excessive heating of the wiring material increases treatment costs. In the present invention, the costs can be reduced by controlling the heating temperature to 900° C. or less.

In a more preferred embodiment, the above heat treatment is performed within a range of from 600° C. to 900° C., inclusive, to thereby sufficiently soften the wire material and the pins.

The pins of the present invention are preferably formed of a copper material.

As compared with ferrous materials such as kovar and 42 Alloy, copper materials such as pure copper, 194 Alloy, phosphor bronze, nickel silver, and beryllium copper generate a lower degree of work hardening during working of pins such as formation of an enlarged-diameter portion. Thus, the effect of softening the wire material through heat treatment is maintained even after pins are formed from the wire material. Pins formed from a copper material are particularly preferred, in view of their softness.

The aforementioned pins preferably have a Vicker's hardness (Hv) of 70–120.

When soft pins having a Vicker's hardness (Hv) of 120 or less are incorporated in an upright-pin-joined resin substrate, the pins themselves tend to absorb the applied stress, to thereby reduce the stress applied to the joining portion between the pins and the resin substrate or the stress applied to the resin substrate main body. Thus, the upright-pin-joined resin substrate is highly resistant to fracture, reduces variation in strength to fracture among the pins, and provides high reliability.

However, when the Vicker's hardness (Hv) is 70 or less, the pins become excessively soft. Such pins are difficult to produce through press-working or similar methods.

In any one of the above-described pins, the enlarged-diameter portion of the pin preferably has a round surface projecting in a direction opposite the shaft portion.

According to the present invention, the enlarged-diameter portion of the pin has a round surface projecting in a direction opposite the shaft portion. Thus, the pin and the pin pad are joined through soldering in such manner that the round surface of the enlarged-diameter portion faces the pin pad.

As compared with a pin having a nail-head-like flat enlarged-diameter portion, the above pin ensures a larger amount of solder between the enlarged-diameter portion of the pin and the pin pad, thus leading to enhancement of connection strength.

Since the enlarged-diameter portion of the pin has a round surface, stress applied to the pin is not concentrated on a specific point and tends to be absorbed by the entirety of the joining portion. Thus, stress applied to the pin itself or stress applied to the resin substrate main body can be reduced.

In addition, the pins are formed from a wire material which has been softened though heat treatment at high temperature. Accordingly, when stress is applied to the pins, the pins themselves deform to absorb the stress, to thereby reduce the stress applied to the joining portion between the pins and the resin substrate or the stress applied to the resin substrate main body.

Through the above synergistic effect, the upright-pin-joined resin substrate employing the pins is highly resistant to fracture induced by application of stress to the pin, has reduced variation in strength to fracture among pins, and provides high reliability.

Still another technique for solving the above problems is a method of producing pins serving as an input/output terminal and arranged in a standing posture in an upright-pin-joined substrate, which method comprises a wire material heat treatment step of heating a wiring material so as to soften the material, followed by forming the material into pins.

According to the present invention, the wire material is softened, prior to formation of pins, through heat treatment performed in the wire material heat treatment step. Thus, soft pins can be provided by forming such a wire material into pins. When the upright-pin-joined resin substrate includes such pins, the pins themselves tend to absorb stress applied to the pin, to thereby reduce stress applied to the joining portion between the pins and the resin substrate or the stress applied to the resin substrate main body.

By employing pins produced in accordance with the above method, the produced upright-pin-joined resin substrate is highly resistant to fracture induced by application of stress to the pin, has reduced variation in strength to fracture among pins, and provides high reliability.

In the above method of producing pins, the wire material heat treatment step comprises heating the wire material preferably at a temperature falling within a range of from 450° C. to 900° C., inclusive.

According to the present invention, the wire material heat treatment is performed at a high temperature of at least 450° C. Thus, the wire material is completely heat-treated, and the wire material and the pins formed therefrom are sufficiently softened. Therefore, the upright-pin-joined resin substrate employing the pins is highly resistant to fracture induced by application of stress to the pins, has reduced variation in strength to fracture among pins, and provides high reliability.

Since heat treatment of the wire material requires a large amount of energy, excessive heating of the wiring material increases treatment costs. In the present invention, the costs can be reduced by controlling the heating temperature to 900° C. or less.

BRIEF DESCRIPTION OF THE DRAWINGS

FIGS. 3(a) and 3(b) are views showing an upright-pin-joined resin substrate according to an embodiment of the present invention, wherein

FIGS. 4(a) and 4(b) are views showing an upright-pin-joined resin substrate according to an embodiment of the present invention, wherein

FIGS. 6(a) and 6(b) are views showing an upright-pin-joined resin substrate according to an embodiment of the present invention, wherein

FIGS. 7(a) to 7(c) are views showing a method of producing the upright-pin-joined resin substrate according to an embodiment, wherein

Description of Reference Numerals in the Drawings:

1: pin
1A: shaft portion
1B: enlarged-diameter portion
11: upright-pin-joined resin substrate 13: resin substrate
13A: main plane (of resin substrate)
17AP: pin pad
HD: solder

DESCRIPTION OF THE PREFERRED EMBODIMENTS

Embodiments of the present invention will now be described with reference to the drawings. However, the present invention should not be construed as being limited thereto.

Figure 1:
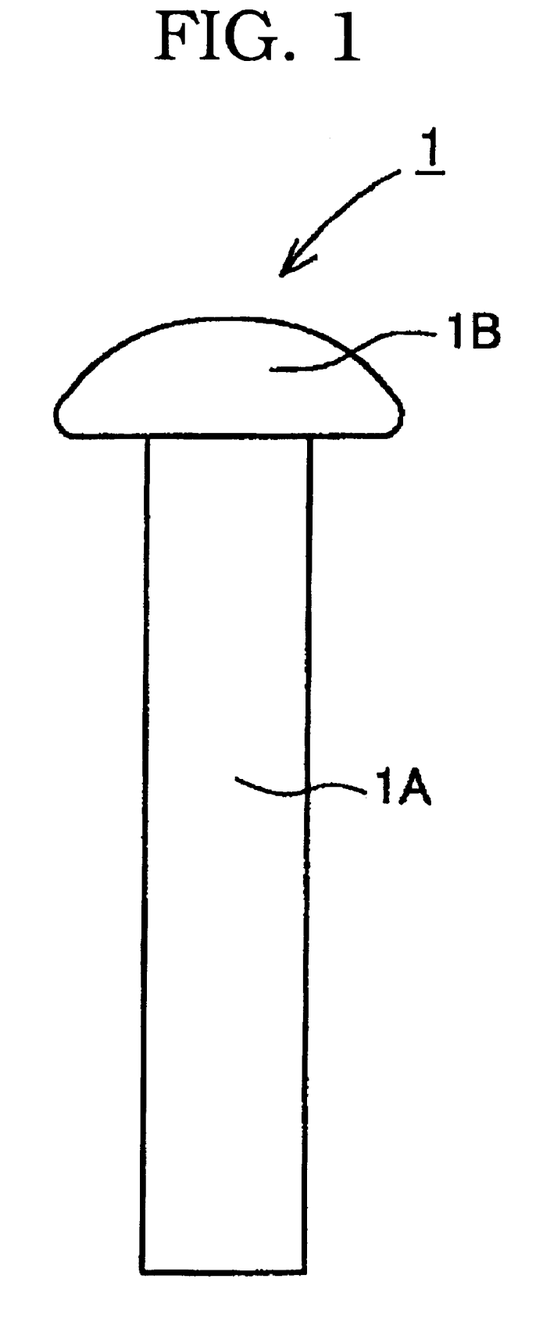
FIG. 1 is an overall view showing a pin according to an embodiment of the present invention.

FIG. 1 shows pin 1 according to one embodiment of the present invention. The pin 1, formed of 194 Alloy, is successively coated with an Ni-plating layer (thickness: approximately 3.34 μm) and an Au-plating layer (thickness: approximately 0.35 μm) (not illustrated). The pin 1 comprises a shaft portion 1A and an enlarged-diameter portion 1B formed at one end of the shaft portion. The shaft portion 1A has a generally cylindrical shape and a diameter of approximately 0.45 mm and a height (length in the axial direction) of 3.01 mm. The enlarged-diameter portion 1B has a shape including a round surface projecting in a direction opposite the shaft portion 1A; more specifically, a generally hemispherical shape with the curved surface facing the direction opposite to the shaft portion 1A. The enlarged-diameter portion 1B has a maximum diameter of approximately 1.2 mm and a height (length in the axial direction) of 0.34 mm.

The pin 1 is obtained by shaping a wire material of 194 Alloy which has been subjected to heat treatment including heating at 450–900° C. followed by gradual cooling.

Since the pin 1 has a generally hemispherical enlarged-diameter portion 1B, stress applied to the pin 1 of the upright-pin-joined substrate tends to be absorbed by the entirety of the joining portion over which the enlarged-diameter portion 1B (round surface) is joined to the substrate by means of a solder. Thus, stress applied to the entirety of the pin 1 or to the substrate main body can be reduced.

According to the above embodiment, a large amount of solder can be provided so as to join pin 1 to the substrate, leading to enhancement of connection strength.

In addition, since the pin 1 is obtained by means of shaping a wire material of 194 Alloy which has been subjected to heat treatment including heating at 450° C.–900° C., the pin 1 has a softness higher than that of a pin obtained from a wire material which has not been subjected to such heat treatment. Thus, if an upright-pin-joined substrate is produced using pins 1, stress applied to the substrate main body or the joining portion between the pins 1 and the substrate can be reduced, since the pins 1 themselves tend to absorb stress applied thereto. When the thus-produced substrate is subjected to a fracture test such as a tensile strength test, fracture does not occur in the joining portion between the pins 1 and the substrate or in the substrate main body, but occurs in the shaft portion 1A of the pin 1. Thus, variation in strength to fracture among the pins can be reduced.

By producing an upright-pin-joined substrate using the pins 1, the upright-pin-joined substrate is highly resistant to fracture even when stress is applied to the pins 1, and variation in strength of resistance to fracture among pins is reduced, leading to high reliability.

The method of producing the aforementioned pin 1 will next be described with reference to FIGS. 2 to 5.

Figure 2:
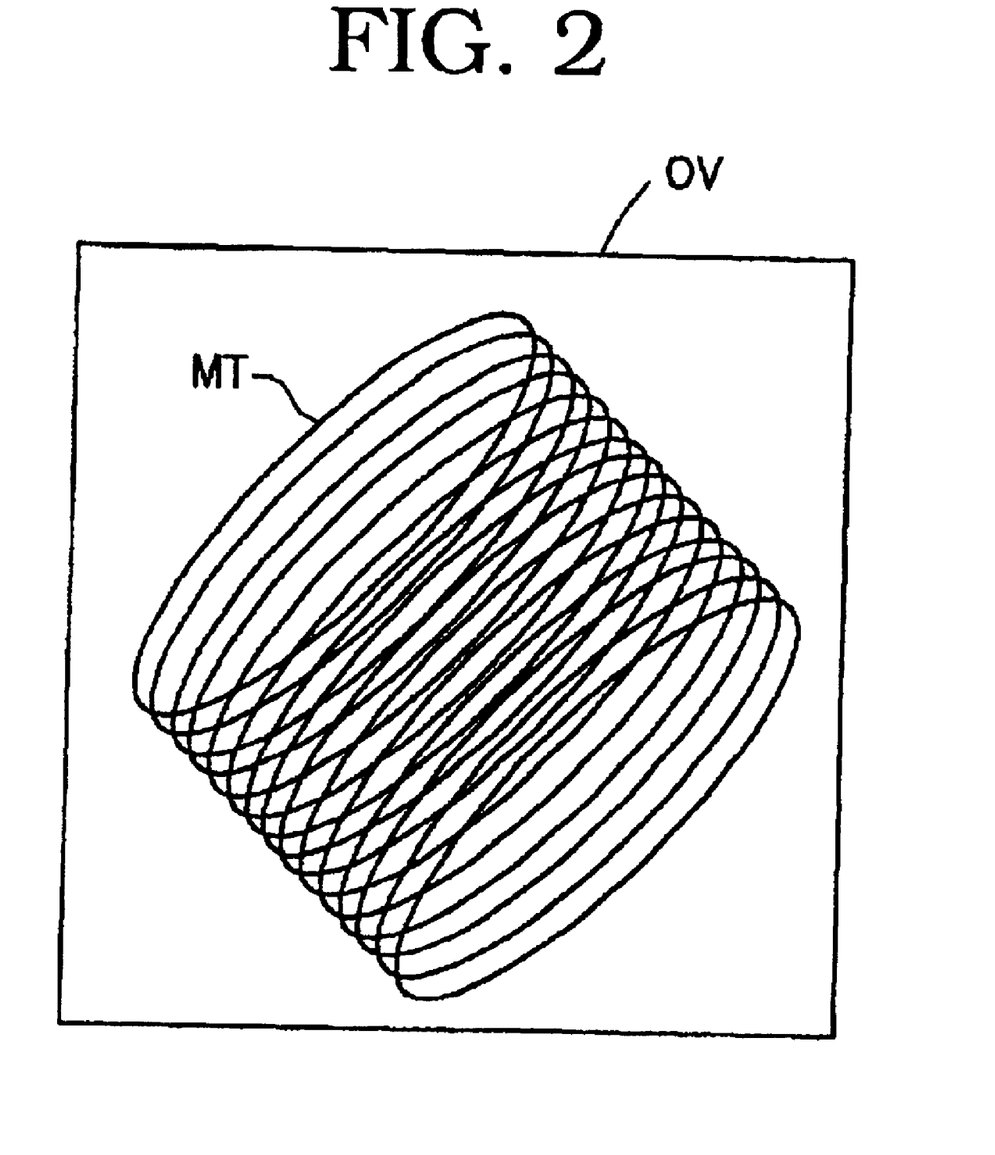
FIG. 2 is a view showing heat-treatment of a wire material involved in a method of producing the pin according to an embodiment of the present invention.

As shown in FIG. 2, a wire material MT which has a generally circular cross-section (Φ: 0.45 mm), is formed of 194 Alloy, and is coiled. In the wire material heat treatment step, the wire material MT is heat treated; i.e., heating at 450° C.–900° C. and then gradually cooled. Specifically, in the present embodiment, the wire material MT is placed in an oven OV, heated to a maximum temperature of 680° C., maintained at 600° C. or higher for 5 minutes or longer, and gradually cooled. Through this heat treatment, strain which has been generated in the wire material MT during working such as drawing for attaining a predetermined diameter of the wire material MT is removed, to thereby soften the wire material MT. The term "gradual cooling" refers to gradually lowering the temperature of a wire material. In general, the wire material MT is gradually cooled at a rate of about 5 to 20° C./min (e.g., 13° C./min).

Although the maximum heating temperature in the above embodiment is 680° C., any heating temperature falling within a range of from 450–900° C. is preferable, in consideration of the degree of softening of the wire material MT attained by the heat treatment, the melting point of the pins 1 (194 Alloy), costs for heat treatment, and other factors.

Figure 3A:
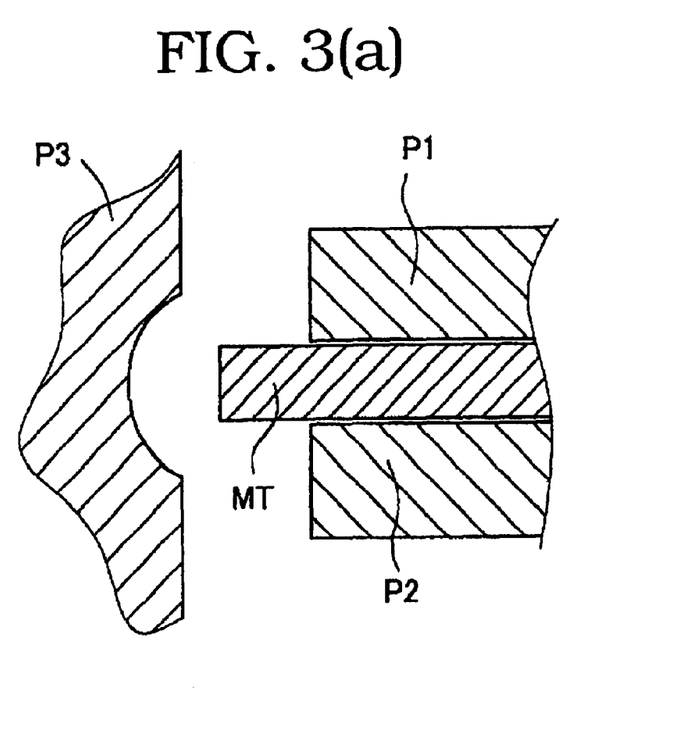
FIG. 3(a) is a view showing a wire material gripped by press molds.

Subsequently, in a first gripping step shown in FIG. 3(a), the wire material MT is gripped by means of press molds P1 and P2 such that a portion of the wire material MT protrudes.

Figure 3B:
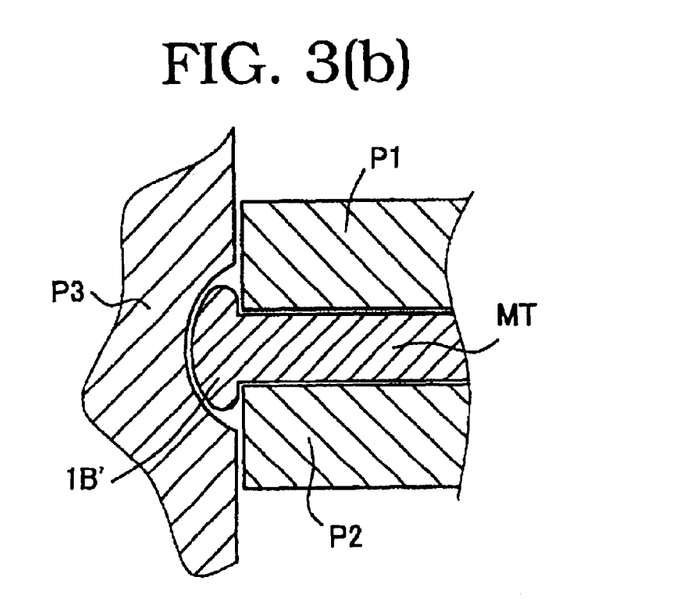
FIG. 3(b) is a view showing formation of a portion of an enlarged-diameter portion through pressing.

In a first pressing step shown in FIG. 3(b), the wire material MT is pressed by means of the press molds P1 and P2 and a press mold P3, to thereby form an enlarged-diameter portion 1B' which is greater in diameter than the wire material MT and has a round surface at the top.

Figure 4A:
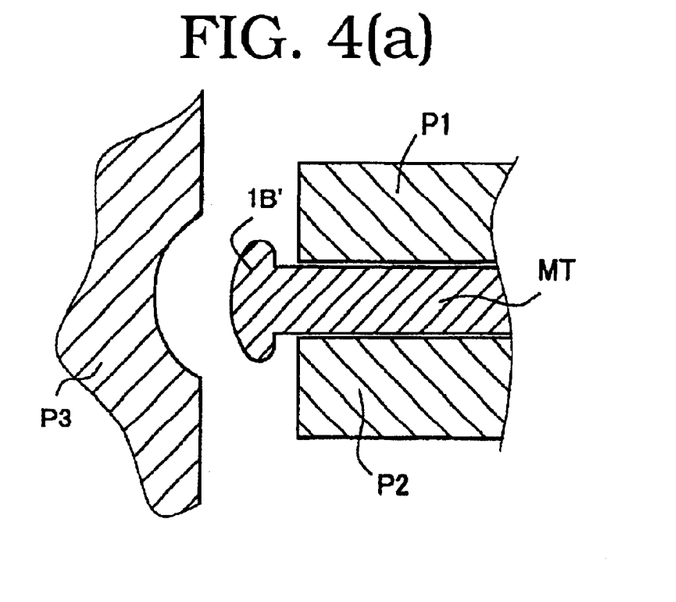
FIG. 4(a) is a view showing a wire material in which of a portion of an enlarged-diameter portion is formed and which is gripped again by press molds.

Next, in a second gripping step shown in FIG. 4(a), the above-worked wire material MT is gripped again by means of the press molds P1 and P2 such that a further portion of the wire material MT protrudes.

Figure 4B:
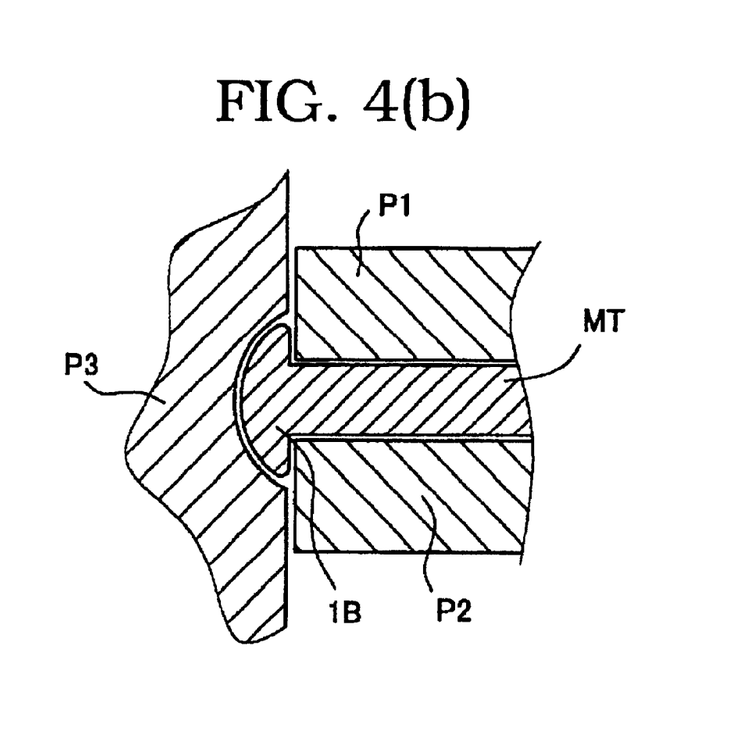
FIG. 4(b) is a view showing formation of the enlarged-diameter portion through pressing.

In a second pressing step shown in FIG. 4(b), the wire material MT is pressed again so as to enlarge the aforementioned enlarged-diameter portion 1B', to thereby form an enlarged-diameter portion 1B of the aforementioned pin 1. Thus, pressing is performed a plurality of times (twice in the present embodiment), to thereby form the enlarged-diameter portion 1B of large height (length in the axial direction).

Subsequently, in a cutting step, the wire material MT is cut at a predetermined position, to thereby form a shaft portion 1A having a diameter generally equal to that of the wire material MT. After cutting, the thus-produced pins 1 are subjected to a surface-smoothing treatment including barrel polishing and chemical etching through a known technique so as to remove fins or to chamfer for removal of sharp edges.

Figure 5:
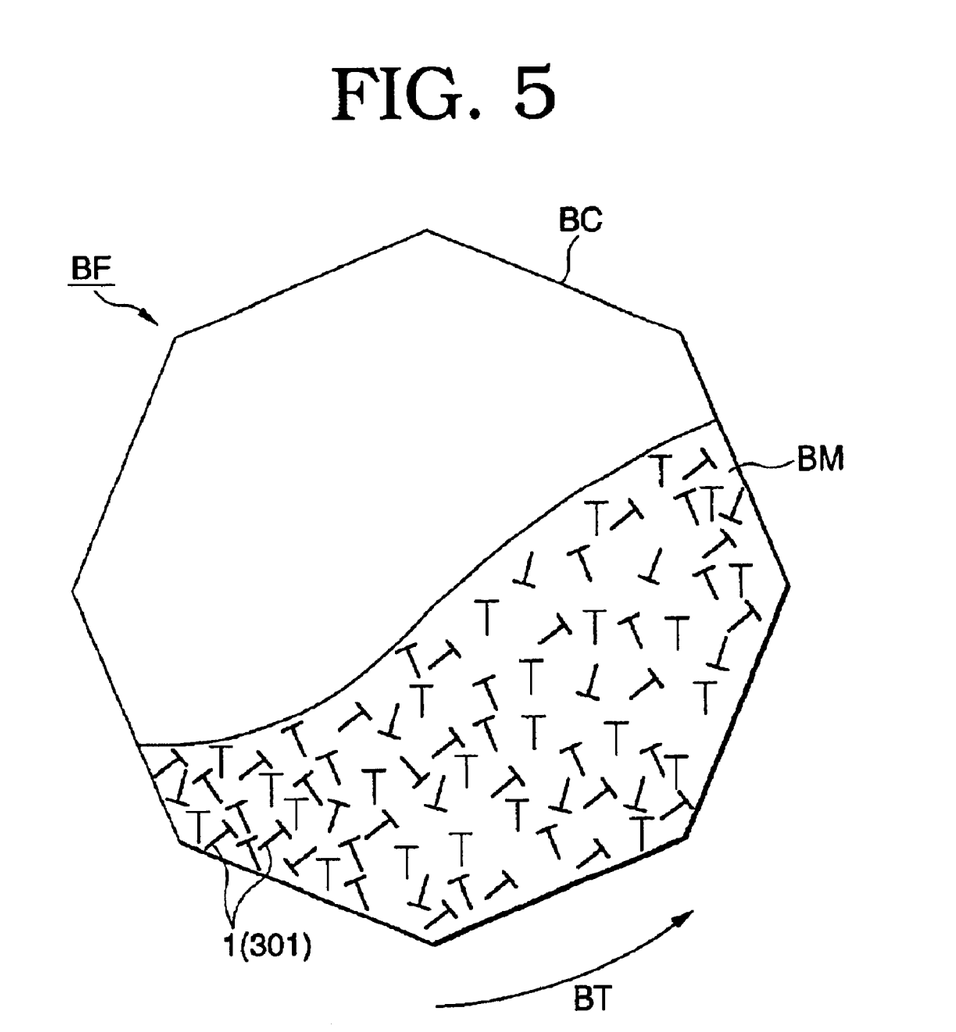
FIG. 5 is a view showing a barrel polishing step in which pins are barrel-polished.

Specifically, in a barrel polishing step, a number of pins 1 and a medium BM formed of alumina balls (diameter: 3.0–5.0 mm) are placed together in a rotatable container BC. of a known rotatable barrel finishing machine BF shown in FIG. 5, and the finishing machine is rotated for several hours in a direction indicated by an arrow BT, to thereby effect barrel polishing. Thus, fins and sharp edges are removed from the pins 1. During barrel polishing, the surface of each pin 1 is slightly hardened through work hardening induced by collision of the pins 1 with the medium BM.

Subsequently, in a surface-smoothening treatment step including chemical etching, the barrel-polished pins 1 are immersed in an acidic solution, and a portion of the surface is dissolved, to thereby attain a smooth surface. The surface-smoothening treatment is preferred also from a standpoint that adsorbed matter such as the medium BM that has intruded into the pins 1 can be removed.

As a measure against oxidation, the thus-treated pins 1 are successively plated with an Ni layer and an Au layer of a thickness of 0.04 μm or more (approximately 0.35 μm in the present embodiment). Thus, formation of the aforementioned pins 1 is completed.

In the method of producing the pins 1, the wire material MT is heat treated at a temperature of 450° C.–900° C., and then gradually cooled. Thus, the wire material MT has a softness higher than that of the same wire material before undergoing the heat treatment. As mentioned above, one conceivable reason for such softening of the wire material MT is that work strain generated during formation of the wire material MT 194 Alloy is removed through this heat treatment.

In the subsequent step of forming the pins 1, since the enlarged-diameter portion 1B of each pin is formed through press working, work strain remains in the enlarged-diameter portion 1B, resulting in a slight increase in hardness. The hardness is also slightly increased in the course of barrel polishing. However, since the wire material MT is softened prior to formation of the pin 1, work strain remaining in the enlarged-diameter portion 1B is relatively low and the softness of the enlarged-diameter portion 1B is maintained to some extent. Particularly, since the pins 1 according to the present embodiment are formed from 194 Alloy, as compared with ferrous materials such as kovar and 42 Alloy, the degree of hardening induced by work strain generated during formation of the enlarged-diameter portion 1B or other processes is considerably low, and the enlarged-diameter portion 1B maintains a certain level of softness.

The Vicker's hardness of the individual pins 1; more specifically, that of the center of a cross-section obtained by cutting the shaft portion 1A, was measured by means of a Vicker's hardness tester (MVK-EII, product of ASAKA). The pin formed from a wiring material MT which had not been heat treated was found to have Hv=147, whereas the pin 1 according to the present embodiment was found to have Hv=109. The enlarged-diameter portion 1B of the pin 1 was found to have a Vicker's hardness slightly higher (by approximately five) than that of the shaft portion 1A. These results indicate that, although the enlarged-diameter portion 1B is slightly hardened by working, the effect of hardening is not significant.

As described below, when the pin 1, particularly the enlarged-diameter portion 1B thereof, employed in the upright-pin-joined substrate is soft, the pin 1 (enlarged-diameter portion 1B) itself deforms to absorb stress applied to the pin 1, to thereby reduce the stress applied to the joining portion between the pin 1 and the substrate or to the substrate main body.

The pin 1 produced through the present method has an enlarged-diameter portion 1B having a round surface. Thus, in the upright-pin-joined substrate employing the pin 1, stress applied to the pin 1 is absorbed by the entirety of the joining portion between the pin 1 and the substrate main body, resulting in reduction of the stress applied to the pin 1 itself or the stress applied to the substrate main body.

In addition, a larger amount of solder can be provided for joining the enlarged-diameter portion 1B of the pin 1 and the substrate main body, thus leading to enhancement of connection strength.

Accordingly, by employing the pin 1 prepared in accordance with the above method, the upright-pin-joined resin substrate thus produced is highly resistant to fracture induced by application of stress to the pin 1 and provides high reliability.

Figure 6A:
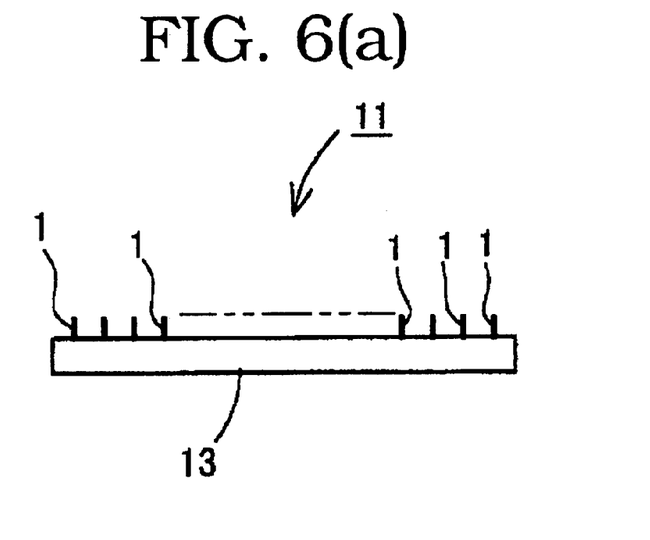
FIG. 6(a) is a side view.
Figure 6B:
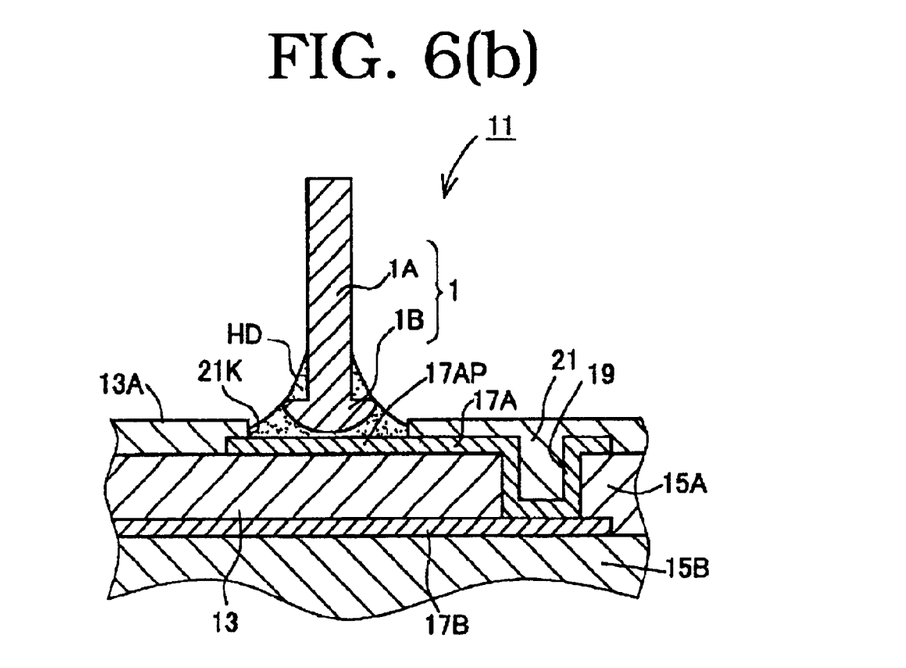
FIG. 6(b) is a partially enlarged sectional view.

The upright-pin-joined resin substrate 11 according to the present embodiment will next be described in detail with reference to FIG. 6. FIG. 6(a) shows a side view of an upright-pin-joined resin substrate 11, and FIG. 6(b) shows a partially enlarged cross-sectional view of the substrate.

The upright-pin-joined resin substrate 11 includes a resin substrate 13 having a generally rectangular plate-like shape, and a number of pins 1 arranged on the substrate in a standing posture.

The resin substrate 13 is a resin-made multi-layer wired substrate which contains a plurality of resin insulating layers 15A and 15B comprising epoxy resin, stacked one on the other, and a solder resist layer 21 comprising epoxy resin formed on the surface of the resin insulating layer 15A.

Conductor layers 17A and 17B (pad, wiring, etc.) are provided between the resin insulating layer 15A and the solder resist layer 21 and between the resin insulating layers 15A and 15B, respectively. A number of conductive via-holes 19 and conductive through-holes (not illustrated) which establish contact between the conductor layers 17A and 17B are provided in the resin insulating layers 15A and 15B.

A number of openings 21K are provided at predetermined sites in the solder resist layer 21 serving as a main plane 13A of the resin substrate 13. In each opening 21K, a pin pad 17AP included in the conductor layer 17A provided between the resin insulating layer 15A and the solder resist layer 21 is exposed.

The pins 1 are joined fixedly to the resin substrate 13 by means of a solder HD (Sn 95%-Sb 5%) in such manner that an enlarged-diameter portion 1B (spherical surface) of each pin 1 faces the pin pad 17AP provided in the resin substrate 13 and that the entirety of the enlarged-diameter portion 1B and a part of the shaft portion 1A connected to the enlarged-diameter portion 1B are joined to the pin pad 17AP through soldering.

The connection strength (tensile strength) of pins 1 provided in the upright-pin-joined resin substrate 11 was measured. Specifically, the shaft portion 1A of any of a number of the pins 1 arranged in a standing posture in the upright-pin-joined resin substrate 11 was gripped and drawn in a direction inclined by 20° from the perpendicular normal to the substrate 11. The tensile strength at which fracture occurred was measured, and the observed modes of fracture were classified.

The tensile test was performed for three upright-pin-joined resin substrates 11, ten pins 1 being tested per substrate. Accordingly, a total of 30 pins 1 formed of the wire material heat-treated at one specific temperature were tested.

In a similar manner, comparative upright-pin-joined resin substrates were produced by joining, to the resin substrate 13 through soldering, pins 1 formed of a wire material MT which had not been heat treated. The connection strength (tensile strength) of the pins 1 was measured in a similar manner, and the observed modes of fracture were classified.

The results of the tensile test are collectively shown in Table 1, and the classification of fracture modes is shown in Table 2.

TABLE 1

Test results of tensile strength of pins
No. of samples: 30/substrate

|  | Average | S.D. | Max. | Min. |
|---|---|---|---|---|
| Embodiment (with heat treatment) | 61.9 N (6.31 kgf) | 0.39 N (0.04 kgf) | 62.8 N (6.40 kgf) | 60.6 N (6.18 kgf) |
| Comparative example (without heat treatment) | 63.3 N (6.45 kgf) | 4.61 N (0.47 kgf) | 67.8 N (6.91 kgf) | 51.0 N (5.20 kgf) |

TABLE 2

Classification of fracture modes observed
at tensile strength test of pins
No. of samples: 30/substrates

|  | Substrate fracture | Solder fracture | Pin fracture |
|---|---|---|---|
| Embodiment (with heat treatment) | 0 (0%) | 0 (0%) | 30 (100%) |
| Comparative example (without heat treatment) | 7 (23%) | 8 (27%) | 15 (50%) |

<Fracture modes>
1) Substrate fracture: fracture in which a portion of the resin substrate under a pin pad is removed
2) Solder fracture: fracture of solder between the enlarged-diameter portion of a pin and a pin pad
3) Pin fracture: fracture of a pin As is clear from Table 1, the comparative pins and upright-pin-joined resin substrates exhibited a large variation (standard deviation) in tensile strength. Some pins of high tensile strength were observed, but other pins of exceptionally low tensile strength (minimum value of 51.0 N (=5.20 kgf)) were also observed. The pins 1 and upright-pin-joined resin substrates 11 according to the embodiment of the present invention exhibited an average tensile strength slightly lower than that of the comparative pins and upright-pin-joined resin substrates. However, the variation (standard deviation) in tensile strength was one-tenth or less then that of the comparative pins and upright-pin-joined substrates, indicating considerably small variation in tensile strength. Thus, since no pins of exceptionally low tensile strength were observed among the pins 1 of the present invention, the pins 1 are identified as all having almost the same tensile strength, leading to high reliability.

As shown in Table 2, some comparative upright-pin-joined resin substrates cause fracture in which a portion of the resin substrate is removed or fracture of the solder HD between the enlarged-diameter portion of a pin and the pin pad 17AP. The reason for these two modes of fracture is considered to be as follows. The enlarged-diameter portion of the comparative pin cannot absorb stress generated in the course of soldering or stress applied thereto during a tensile test. If the stress is concentrated for some reason, fracture is induced from a stress-concentrated portion. Since the tensile strength of the comparative samples varies in accordance with the strength of the solder HD, soldering conditions, the strength of the substrate main body, and other factors, control of tensile strength is difficult and the resulting variation in tensile strength is larger.

The upright-pin-joined resin substrate samples according to the embodiment of the present invention produce only pin fractures; i.e., fractures occurring in the pins 1 and without substrate fracture or solder fracture. The reason for this mode of fracture is considered to be as follows. By virtue of the softness of the enlarged-diameter portion 1B of the pin 1, stress generated in the course of soldering or stress applied thereto during a tensile test can be absorbed by the enlarged-diameter portion 1B of the pin 1. Thus, fracture is not induced from a stress-absorbed portion, but rather the pin 1 is fractured.

In addition, in the upright-pin-joined resin substrate 11, the pin 1 having a generally hemispherical enlarged-diameter portion 1B is joined to the resin substrate 13 by means of a solder HD in such manner that the enlarged-diameter portion 1B faces the pin pad 17AP provided in the resin substrate 13. Thus, stress applied to the pin 1 tends to be absorbed by the entirety of the joining portion, and the stress applied to the pin 1 or to the substrate main body 13 can be reduced.

Furthermore, a large amount of solder HD is provided between the enlarged-diameter portion 1B and the pin pad 17AP, leading to enhancement of connection strength.

As described above, the pin 1 is obtained by shaping the wire material MT which has been heat-treated at a temperature of from 450° C.–900° C. and then gradually cooled. Through the above synergistic effect, the upright-pin-joined resin substrate 11 is highly resistant to fracture induced by application of stress to the pin 1, has reduced variation in strength to fracture among pins, and provides high reliability.

Figure 7A:
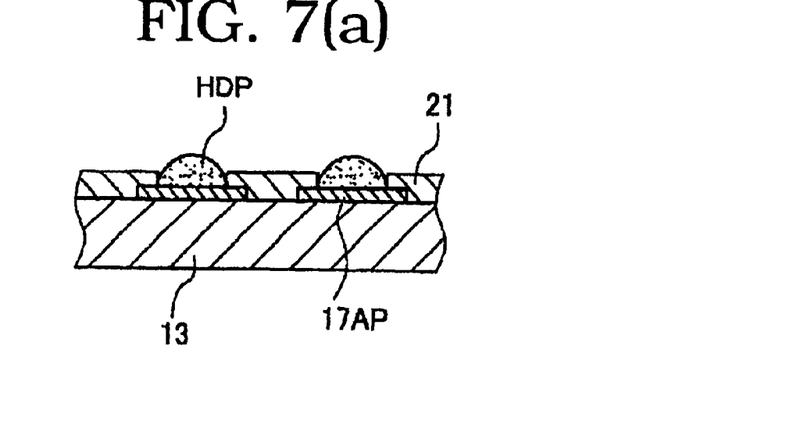
FIG. 7(a) is a view showing a state after solder paste has been applied onto a pin pad provided in a resin substrate.

The method of producing the aforementioned upright-pin-joined resin substrate 11 will next be described with reference to FIG. 7.

In a manner similar to that described above, a wire material MT is subjected to heat treatment; i.e., heating at a temperature of from 450° C.–900° C. and then gradually cooled in the wire material heat treatment step. Specifically, in a similar manner, the wire material MT is heated to a maximum temperature of 680° C., maintained at 600° C. or higher for 5 minutes or longer, and gradually cooled (see FIG. 2). Through this heat treatment, work strain which has been generated in the wire material MT during working such as drawing is removed, to thereby sufficiently soften the wire material MT.

Subsequently, pins 1 having a shaft portion 1A and an enlarged-diameter portion 1B are produced by shaping the wire material MT. Specifically, the aforementioned first gripping step, first pressing step, second gripping step, second pressing step, and cutting step are performed. Then, the surface-smoothening treatment step including barrel polishing and chemical etching is performed, to thereby form the pins 1 (see FIGS. 3 to 5).

As a measure against oxidation, the thus-treated pins 1 are successively plated with an Ni layer having a thickness of approximately 3 μm and an Au layer having a thickness of approximately 0.35 μm.

Subsequently, the aforementioned resin substrate 13 is prepared. The resin substrate 13 is produced by a known technique; specifically, by the steps of alternately forming the resin insulating layers 15 and the conductor layers 17, and forming the solder resist layer 21. Next, in a solder printing step, as shown in FIG. 7(a), a predetermined amount of a solder paste HDP (Sn 95%, Sb 5%) is applied, through printing, to each of the pin pads 17AP provided in the resin substrate 13.

Figure 7B:
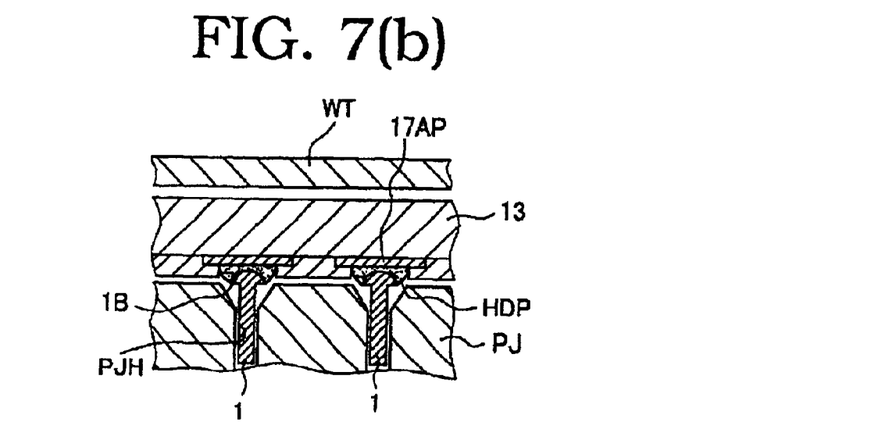
FIG. 7(b) is a view showing a state after the resin substrate has been placed on a pin-standing jig, to thereby bring an enlarged-diameter portion of a pin into contact with the solder paste.
Figure 7C:
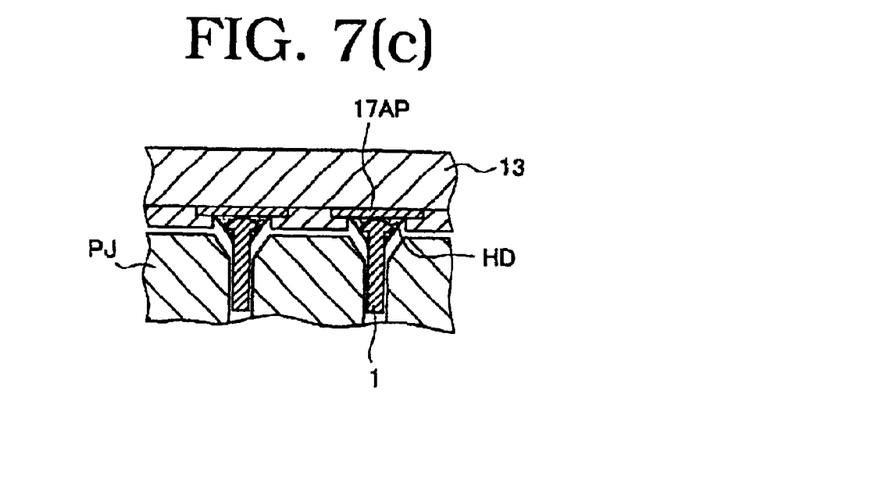
FIG. 7(c) is a view showing a state after the solder paste has been reflowed, to thereby join the pins to the pin pads through soldering.
Figure 8:
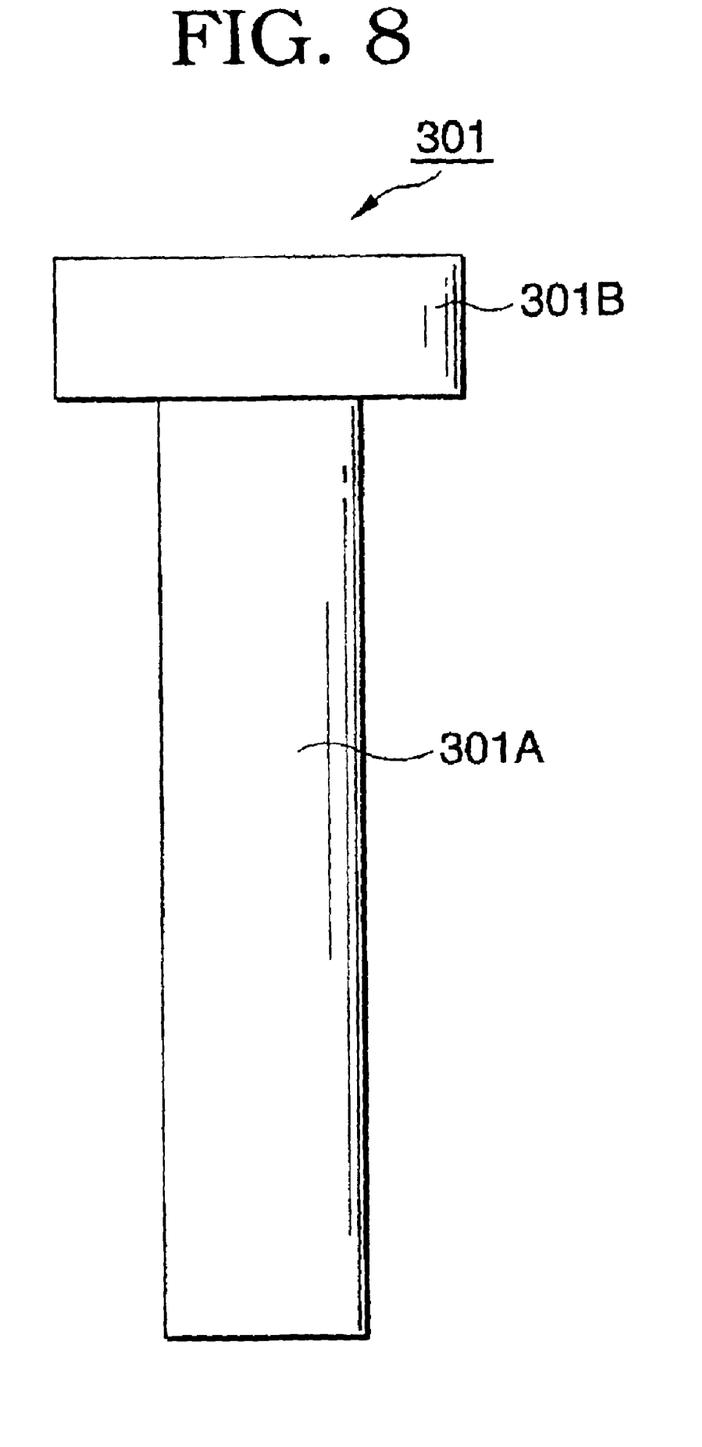
FIG. 8 is an overall view showing a pin having a flat enlarged-diameter portion according to another embodiment of the present invention.

Subsequently, in a placement step, as shown in FIG. 7(b), each of the pins 1 is placed in a pin-standing jig hole PJH provided in a pin-standing jig PJ, and the resin substrate 13 onto which the solder paste HDP has been applied through printing is placed on the pin-standing jig PJ so as to align the enlarged-diameter portions 1B of the pins 1 with the corresponding pin pads 17AP and abut the enlarged-diameter portions on the pin pads. Then, a weight WT is placed on the resin substrate 13, to thereby press the resin substrate 13.

Next, in a reflow step, the resin substrate 13 placed on the pin-standing jig PJ is introduced in a reflow furnace (not illustrated). As shown in FIG. 7(c), the solder paste HDP is caused to melt, and the enlarged-diameter portions 1B and other portions of the pins 1 are joined through soldering to the corresponding pin pads 17AP, to thereby complete the aforementioned upright-pinjoined resin substrate 11. In the present embodiment, the combination of the solder printing step, the placement step, and the reflow step corresponds to a pin fixation step.

According to the method of the present invention, the wire material MT is subjected to heat treatment including heating at a temperature of from 450° C.–900° C., followed by gradually cooling in the wire material heat treatment step. The wire material MT and the pins 1 thus produced by shaping the material have a softness higher than that of the same wire material before undergoing the heat treatment. Therefore, in the thus-produced upright-pin-joined resin substrate 11, when stress is applied to each pin 1, the pin 1 itself absorbs the stress, to thereby reduce the stress applied to the joining portion between the pin 1 and the resin substrate 13 or the stress applied to the resin substrate main body 13.

According to the method of the present invention, the enlarged-diameter portion 1B having a spherical surface is caused to abut the pin pad 17AP, and the enlarged-diameter portion 1B is joined through soldering to the pin pad 17AP. In the thus-produced upright-pin-joined resin substrate 11, when stress is applied to each pin 1, the entirety of the joining portion between the pin 1 and the resin substrate 13 absorbs the stress, to thereby reduce the stress applied to the pin 1 or to the resin substrate main body 13.

In addition, a large amount of solder HD can be provided between the enlarged-diameter portion 1B of the pin 1 and the pin pad 17AP, thus leading to enhancement of connection strength.

According to the method of producing an upright-pin-joined substrate, the thus produced upright-pin-joined substrate 11 is highly resistant to fracture even when stress is applied to the pin 1, and variation in strength to fracture among pins is reduced, leading to high reliability.

The present invention has been described hereinabove with reference to embodiments, which should not be construed as limiting the scope of the invention. It is to be understood that changes and variations may be made without departing from the spirit or scope of the invention.

For example, although the pin 1 having a generally hemispherical enlarged-diameter portion 1B is employed in the aforementioned embodiments, the enlarged-diameter portion 1B may have another shape, such as a disk-like shape as shown in FIG. 3. Even though the pin has such a shape (e.g. shaft portion 301A, flat enlarged-diameter portion 301B), an upright-pin-joined resin substrate can be produced which is highly resistant to fracture induced by application of stress to the pin 301 and which provides high reliability, so long as the wire material has been subjected to heat treatment at high temperature, to thereby provide soft pins.

In a manner similar to that employed in the above embodiments, pins may be produced by shaping a preheated wire material comprising a ferrous material such as kovar or 42 Alloy, to thereby produce an upright-pin-joined resin substrate. However, ferrous materials generate greater work hardening concomitant with work strain during formation of the enlarged-diameter portion. Thus, copper materials such as 194 Alloy, which is employed in the above embodiments, are preferred.

Furthermore, although Sn/Sb solder is employed as the solder HD in the above embodiments, Pb/Sn solder and Sn/Ag solder may also be employed.

This application is based on Japanese Patent Application No. 2001-228135 filed Jul. 27, 2001, the disclosure of which is incorporated herein by reference in its entirety.

What is claimed is:

1. An upright-pin-joined resin substrate, comprising:
a resin substrate having a plate shape and a main plane, formed from a resin or a resin-containing composite material, and including a pin pad exposed on the main plane; and
a pin joined to the pin pad by means of a solder,
wherein the pin is formed from a wire material which has been softened through heat treatment prior to formation of the pin, said pin having a shaft portion and an enlarged-diameter portion greater in diameter than the shaft portion, the enlarged-diameter portion being formed at one end of the shaft portion; and
at least the enlarged-diameter portion of the pin is joined to the pin pad by means of a solder.

2. The upright-pin-joined resin substrate as claimed in claim 1, wherein the pin is formed from a wire material which has been heat treated at a temperature of from 450° C. to 900° C.

3. The upright-pin-joined resin substrate as claimed in claim 1, wherein the pin is formed of a copper material.

4. The upright-pin-joined resin substrate as claimed in claim 3, wherein the pin has a Vicker's hardness (Hv) of 70–120.

5. The upright-pin-joined resin substrate as claimed in claim 1, wherein the enlarged-diameter portion of the pin has a round surface projecting in a direction opposite the shaft portion.

6. The upright-pin-joined resin substrate as claimed in claim 1, wherein said substrate comprises a plurality of exposed pin pads and a plurality of pins formed from a wire material which has been softened through heat treatment joined to respective pin pads by means of a solder.

7. A method of producing an upright-pin-joined resin substrate having a plate shape and a main plane, formed from a resin or a resin-containing composite material, and including a pin pad exposed on the main plane; and
a pin joined to the pin pad by means of a solder,
wherein the pin is formed from a wire material which has been softened through heat treatment prior to formation of the pin, said pin having a shaft portion and an enlarged-diameter portion greater in diameter than the shaft portion, the enlarged-diameter portion being formed at one end of the shaft portion; and
at least the enlarged-diameter portion of the pin is joined to the pin pad by means of a solder,
said method comprising a wire material heat treatment step including heat-treating a wire material to thereby soften the wire material; a pin formation step including forming, from the wire material which has been subjected to the heat treatment, a pin comprising a shaft portion and an enlarged-diameter portion greater in diameter than the shaft portion and formed at one end of the shaft portion; and a pin fixation step including fixing at least the enlarged-diameter portion of the pin on the pin pad through soldering while the enlarged-diameter portion of the pin is caused to abut the pin pad.

8. The method of producing an upright-pin-joined resin substrate as claimed in claim 7, wherein the heat treatment comprises heating the wire material at a temperature of from 450° C. to 900° C.

9. The method of producing an upright-pin-joined resin substrate as claimed in claim 7, wherein the wire material is formed of a copper material.

10. The method of producing an upright-pin-joined resin substrate as claimed in claim 7, wherein said substrate comprises a plurality of exposed pin pads, and said method comprises forming a plurality of pins formed from said heat-treated wire material and fixing a plurality of pins thus formed to respective pin pads.

\* \* \* \* \*